(12) United States Patent  (10) Patent No.: US 9,397,206 B2
Kameyama  (45) Date of Patent: Jul. 19, 2016

(54) SEMICONDUCTOR DEVICE AND METHOD FOR MANUFACTURING THE SAME

(75) Inventor: Satoru Kameyama, Toyota (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 0 days.

(21) Appl. No.: 14/356,984

(22) PCT Filed: Nov. 9, 2011

(86) PCT No.: PCT/JP2011/075838
§ 371 (c)(1),
(2), (4) Date: May 8, 2014

(87) PCT Pub. No.: WO2013/069113
PCT Pub. Date: May 16, 2013

(65) Prior Publication Data
US 2014/0306267 A1  Oct. 16, 2014

(51) Int. Cl.
H01L 29/06 (2006.01)
H01L 29/739 (2006.01)
H01L 29/861 (2006.01)
H01L 27/06 (2006.01)
H01L 21/265 (2006.01)
H01L 21/268 (2006.01)
H01L 29/66 (2006.01)
H01L 29/08 (2006.01)
H01L 29/36 (2006.01)

(52) U.S. Cl.
CPC .......... *H01L 29/7395* (2013.01); *H01L 21/268* (2013.01); *H01L 21/26513* (2013.01); *H01L 27/0664* (2013.01); *H01L 29/0834* (2013.01); *H01L 29/36* (2013.01); *H01L 29/6609* (2013.01); *H01L 29/66333* (2013.01); *H01L 29/66348* (2013.01); *H01L 29/7397* (2013.01); *H01L 29/861* (2013.01)

(58) Field of Classification Search
CPC .................................................... H01L 27/0664
See application file for complete search history.

(56) References Cited

U.S. PATENT DOCUMENTS

2010/0025827 A1* 2/2010 Fujii ........................ H01L 29/36
257/656
2010/0244093 A1 9/2010 Rahimo et al.
2010/0270587 A1 10/2010 Rahimo et al.
(Continued)

FOREIGN PATENT DOCUMENTS

CN  101884106 A  11/2010
JP  2001-332729 A  11/2001
(Continued)

OTHER PUBLICATIONS

EPO translation of WO 2011/125156 (Published on Oct. 13, 2011).*

Primary Examiner — Peniel M Gumedzoe
Assistant Examiner — Christopher Johnson
(74) Attorney, Agent, or Firm — Kenyon & Kenyon LLP

(57) ABSTRACT

A semiconductor device including a semiconductor substrate in which a diode region and an IGBT region are formed is provided. In the semiconductor device, the diode region includes a second conductivity type cathode layer. An impurity concentration of second conductivity type impurities of the cathode layer is distributed in a curve pattern having at least two peaks, and the impurity concentration of the second conductivity type impurities is higher than that of first conductivity type impurities at all depths of the cathode layer.

4 Claims, 12 Drawing Sheets

(56) References Cited

U.S. PATENT DOCUMENTS

| | | |
|---|---|---|
| 2010/0295093 A1 | 11/2010 | Rahimo et al. |
| 2012/0187416 A1* | 7/2012 | Honda .............. H01L 29/0834 257/77 |
| 2013/0001639 A1 | 1/2013 | Iwasaki et al. |

FOREIGN PATENT DOCUMENTS

| | | |
|---|---|---|
| JP | 2011-507299 A | 3/2011 |
| JP | 2011-507300 A | 3/2011 |
| WO | 2011125156 A1 | 10/2011 |

* cited by examiner

SEMICONDUCTOR DEVICE AND METHOD FOR MANUFACTURING THE SAME

CROSS-REFERENCE TO RELATED APPLICATIONS

This is a national phase application based on the PCT International Patent Application No. PCT/JP2011/075838 filed Nov. 9, 2011, the entire contents of which are incorporated herein by reference.

TECHNICAL FIELD

A technology described in this specification relates to a semiconductor device and a method for manufacturing the same.

BACKGROUND ART

A semiconductor device including a semiconductor substrate in which a diode region and an IGBT region are formed has been known. In the diode region, an n-type cathode layer is formed on a lower surface side of the semiconductor substrate, while in the IGBT region, a p-type collector layer is formed on the lower surface side of the semiconductor substrate. The collector layer and the cathode layer are formed in general by doping impurity ions to the lower surface side of the semiconductor substrate. For example, after p-type impurity ions are doped to the entire lower surface of the semiconductor substrate, the region which becomes the collector layer on the lower surface is covered by a mask and n-type impurity ions are doped, and the impurities are diffused by an annealing process. In this case, in the cathode layer, if a dose amount of the n-type impurity ions is not high enough to compensate for a dose amount of the p-type impurity ions, voltage/current characteristics (VI characteristics) of the semiconductor device deteriorates, and a snapback phenomenon can easily occur.

In order to avoid this problem, in Japanese Patent Application Publication No 2011-507299 (Patent Literature 1), the region on the lower surface of the semiconductor substrate where the cathode layer is to be formed is covered by a mask, the p-type semiconductor layer which becomes a collector layer is deposited on an opening portion of the mask, and a metal film is formed on the lower surface thereof. After that, the mask is removed, and the n-type impurity ions are doped to the region on the lower surface of the semiconductor substrate where the cathode layer is to be formed by using the metal film as a mask.

Moreover, in Japanese Patent Application Publication No. 2011-507300 (Patent Literature 2), after the p-type impurity ions are doped to the entire lower surface of the semiconductor substrate, the semiconductor substrate in the region where a cathode layer is to be formed is removed by etching or the like using the mask. After the layer to which the p-type impurity ions are doped is removed, the n-type impurity ions are doped so as to form a cathode layer.

CITATION LIST

Patent Literatures

Patent Document 1: Japanese Patent Application Publication No. 2011-507299
Patent Document 2: Japanese Patent Application Publication No. 2011-507300

SUMMARY OF INVENTION

Technical Problem

In Patent Document 1 and Patent Document 2, either one of the cathode layer and the collector layer is recessed with respect to the other, and a step is generated on the lower surface of the semiconductor substrate. The step on the lower surface of the semiconductor substrate can become a factor causing nonconformity when a lower surface electrode or the like is to be formed. Moreover, a process of forming the step on the lower surface of the semiconductor substrate is added, which complicates the manufacturing process.

Solution to Problem

A first semiconductor device disclosed in this specification comprises a semiconductor substrate in which a diode region and an IGBT region are formed. The diode region comprises a first conductivity type anode layer exposed at an upper surface of the semiconductor substrate, a second conductivity type diode drift layer formed on a lower surface side of the anode layer, and a second conductivity type cathode layer formed on a lower surface side of the diode drift layer. The IGBT region comprises a second conductivity type emitter layer exposed at the upper surface of the semiconductor substrate, a first conductivity type tom body layer formed on a lower surface side of the emitter layer, a second conductivity type IGBT drift layer formed on a lower surface side of the IGBT body layer, a first conductivity type collector layer formed on a lower surface side of the IGBT drift layer, and an IGBT gate electrode facing a range of the IGBT body layer via an insulating film, which the range of the IGBT layer separates the emitter layer and the IGBT drift layer. An impurity concentration of second conductivity type impurities of the cathode layer is distributed in a curve pattern having at least two peaks, and the impurity concentration of the second conductivity type impurities is higher than that of first conductivity type impurities at all depths of the cathode layer.

In the above first semiconductor device, the impurity concentration of the second conductivity type impurities of the cathode layer is distributed in a curve pattern having at least two peaks. The distribution of the impurity concentration having at least two peaks can be formed by doping ions at least two times to different depths. As a result, the impurity concentration of the second conductivity type impurities can realize a state higher than the impurity concentration of the first conductivity type impurities at all the depths of the cathode layer more reliably. In the above semiconductor device, deterioration of the VI characteristics of the semiconductor device and occurrence of snapback are suppressed, and the above semiconductor device can be manufactured in a simple manufacturing process without requiring a change of the shape of a lower surface of the semiconductor substrate.

Moreover, the technology according to the above first semiconductor device (technology relating to the impurity concentration distribution of the cathode layer) can be also used for the collector layer. That is, this specification also discloses a semiconductor device comprising a semiconductor substrate in which a diode region and an IGBT region are formed, an impurity concentration of first conductivity type impurities of the collector layer is distributed in a curve pattern having at least two peaks, and the impurity concentration of the first conductivity type impurities is higher than the impurity concentration of second conductivity type impurities at all depths of the collector layer.

A second semiconductor device disclosed in this specification comprises a semiconductor substrate in which a diode region and an IGBT region are formed. The diode region comprises a first conductivity type anode layer exposed at an upper surface of the semiconductor substrate, a second conductivity type diode drift layer formed on a lower surface side of the anode layer, and a second conductivity type cathode layer formed on a lower surface side of the diode drift layer. The IGBT region comprises a second conductivity type emitter layer exposed at the upper surface of the semiconductor substrate, a first conductivity type IGBT body layer formed on a lower surface side of the emitter layer, a second conductivity type IGBT drift layer formed on a lower surface side of the IGBT body layer, a first conductivity type collector layer formed on a lower surface side of the IGBT drift layer, and an IGBT gate electrode facing a range of the IGBT body layer via an insulating film, which the range of the IGBT body layer separates the emitter layer and the IGBT drift layer. An impurity concentration of first conductivity type impurities of the cathode layer is distributed constantly from a lower surface of the semiconductor substrate to a first depth, an impurity concentration of second conductivity type impurities of the cathode layer is distributed constantly from the lower surface of the semiconductor substrate to a second depth, the second depth is deeper than the first depth, and the impurity concentration of the second conductivity type impurities is higher than that of the first conductivity type impurities at all depths of the cathode layer.

In the above second semiconductor device, the impurity concentration of the first conductivity type impurities and the impurity concentration of the second conductivity type impurities of the cathode layer are both distributed constantly from the lower surface of the semiconductor substrate. Since the impurity concentrations are distributed constantly, by setting the second depth deeper than the first depth, a state in which the impurity concentration of the second conductivity type impurities is higher than that of the first conductivity type impurities at all the depths of the cathode layer can be realized more reliably. In the above semiconductor device, deterioration of the VI characteristics of the semiconductor device and occurrence of snapback are suppressed, and the above semiconductor device can be manufactured in a simple manufacturing process without requiring a change of the shape of a lower surface of the semiconductor substrate.

Moreover, the technology according to the above second semiconductor device (technology relating to the impurity concentration distribution of the cathode layer) can be also used for the collector layer. That is, this specification also discloses a semiconductor device comprising a semiconductor substrate in which a diode region and an IGBT region are formed, an impurity concentration of first conductivity type impurities of the collector layer is distributed constantly from a lower surface of the semiconductor substrate to a third depth, an impurity concentration of second conductivity type impurities of the collector layer is distributed constantly from the lower surface of the semiconductor substrate to a fourth depth, the third depth is deeper than the fourth depth, and the impurity concentration of the first conductivity type impurities is higher than the impurity concentration of the second conductivity type impurities at all depths of the collector layer.

This specification also discloses a method for manufacturing the first semiconductor device. In the method for manufacturing the first semiconductor device disclosed in this specification, forming of the cathode layer of the semiconductor device includes doping first conductivity type impurity ions to a lower surface of a semiconductor wafer, doping second conductivity type impurity ions to the lower surface of the semiconductor wafer at least two times to different depths, and annealing the semiconductor wafer that has been doped with the first conductivity type impurity ions and the second conductivity type impurity ions. If the technology according to the first semiconductor device is used for the collector layer, the forming of the collector layer of the semiconductor device includes doping second conductivity type impurity ions to a lower surface of the semiconductor wafer, doping first conductivity type impurity ions to the lower surface of the semiconductor wafer at least two times to different depths, and annealing the semiconductor wafer that has been doped with the first conductivity type impurity ions and the second conductivity type impurity ions.

This specification also discloses a method for manufacturing the second semiconductor device. In the method for manufacturing the second semiconductor device disclosed in this specification, forming of the cathode layer of the semiconductor device includes doping second conductivity type impurity ions to a lower surface of a semiconductor wafer, laser annealing the semiconductor wafer to the second depth after having doped the second conductivity type impurity ions, doping first conductivity type impurity ions to the lower surface of the semiconductor wafer, and laser annealing the semiconductor wafer to the first depth after having doped the first conductivity type impurity ions. If the technology according to the second semiconductor device is used for the collector layer, the forming of the collector layer of the semiconductor device includes doping first conductivity type impurity ions to a lower surface of a semiconductor wafer, laser annealing the semiconductor wafer to the third depth after having doped the first conductivity type impurity ions, doping second conductivity type impurity ions to the lower surface of the semiconductor wafer, and laser annealing the semiconductor wafer to the fourth depth after having doped the second conductivity type impurity ions.

DESCRIPTION OF EMBODIMENTS

Figure 1:
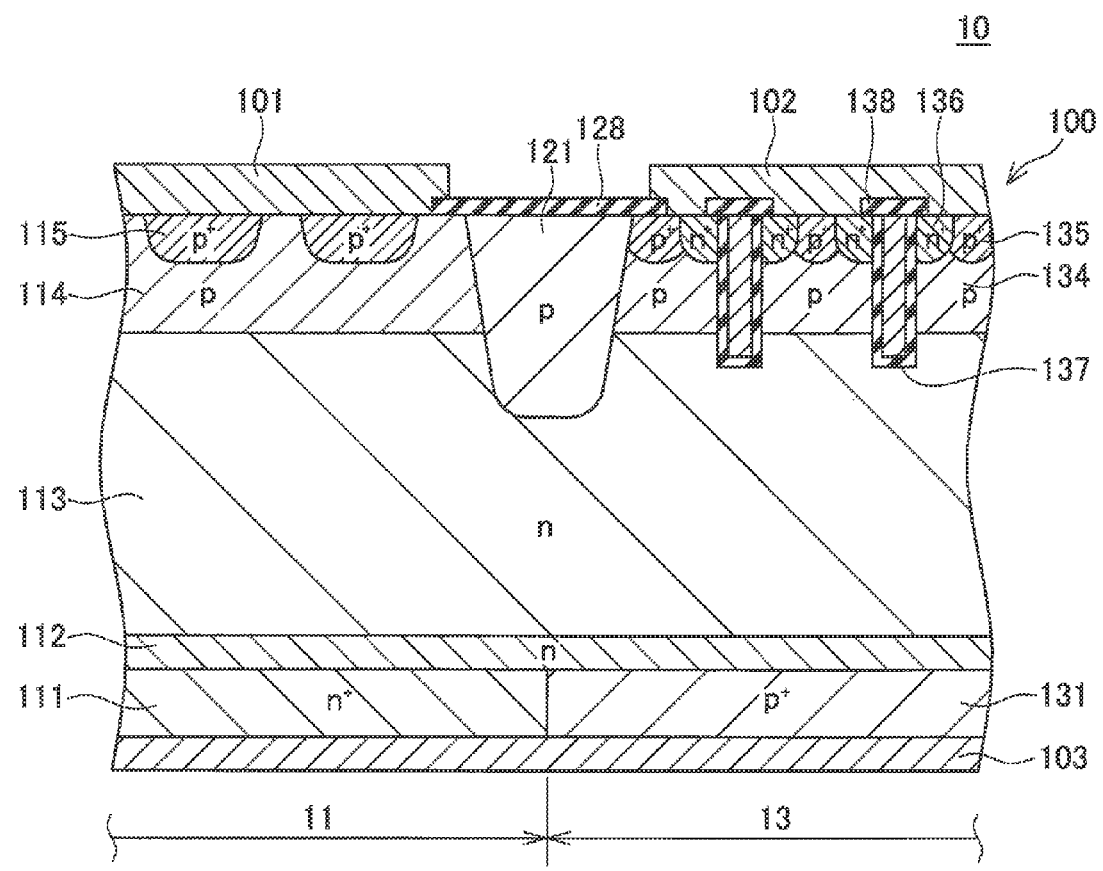
FIG. 1 is a sectional view of a semiconductor device according to an embodiment 1.

Each of a first semiconductor device and a second semiconductor device disclosed in this specification comprises a semiconductor substrate, in which a diode region and an IGBT region are formed. The diode region comprises a first conductivity type anode layer exposed at an upper surface of the semiconductor substrate, a second conductivity type diode drift layer formed on a lower surface side of the anode layer, and a second conductivity type cathode layer formed on a lower surface side of the diode drift layer. The IGBT region comprises a second conductivity type emitter layer exposed at the upper surface of the semiconductor substrate, a first conductivity type IGBT body layer formed on a lower surface side of the emitter layer, a second conductivity type IGBT drift layer formed on a lower surface side of the IGBT body layer, a first conductivity type collector layer formed on a lower surface side of the IGBT drift layer, and an IGBT gate electrode facing a range of the IGBT body layer via an insulating film, which the range of the IGBT body layer separates the emitter layer and the IGBT drift layer.

The first semiconductor device and the second semiconductor device may be semiconductor devices having the same upper surface structures of the diode regions and the IGBT regions and different only in the lower surface structures. Moreover, the first semiconductor device and the second semiconductor device may be semiconductor devices having different upper surface structures of the diode regions and different upper surface structures of the IGBT regions. Furthermore, a separation region may be formed between the diode region and the IGBT region. The separation region is an inactive region not in contact with an upper surface electrode, for example, and in the semiconductor substrate, a first conductivity type semiconductor layer deeper than the diode body layer and the IGBT body layer may be formed on the upper surface side in the semiconductor substrate, for example. Moreover, a separation trench deeper than the diode body layer and the IGBT body layer may be formed on the upper surface side in the semiconductor substrate. Furthermore, a buffer layer may be provided in contact with the lower surface of the drift layer, and the collector layer and the cathode layer may be formed in contact with the lower surface of the buffer layer.

The technology according to the first semiconductor device can be used for either one of or both of the cathode layer and the collector layer of the semiconductor device. When the technology according to the first semiconductor device is used for the cathode layer, in the first semiconductor device, an impurity concentration of second conductivity type impurities of the cathode layer is distributed in a curve pattern having at least two peaks, and the impurity concentration of the second conductivity type impurities is higher than that of the first conductivity type impurities at all depths of the cathode layer. When the technology according to the first semiconductor device is used for the collector layer, the impurity concentration of first conductivity type impurities of the collector layer is distributed in a curve pattern having at least two peaks, and the impurity concentration of the first conductivity type impurities is higher than that of the second conductivity type impurities at all depths of the collector layer. Moreover, in the first semiconductor device, both the cathode layer and the collector layer may have the above configuration.

Similarly, the technology according to the second semiconductor device can be used for either one of or both of the cathode layer and the collector layer of the semiconductor device. When the technology according to the second semiconductor device is used for the cathode layer, in the second semiconductor device, an impurity concentration of first conductivity type impurities of the cathode layer is distributed constantly from a lower surface of a semiconductor substrate to a first depth, an impurity concentration of second conductivity type impurities of the cathode layer is distributed constantly from the lower surface of the semiconductor substrate to a second depth, the second depth is deeper than the first depth, and the impurity concentration of the second conductivity type impurities is higher than that of the first conductivity type impurities at all depths of the cathode layer. When the technology according to the second semiconductor device is used for the collector layer, the impurity concentration of the first conductivity type impurities of the collector layer is distributed constantly from the lower surface of the semiconductor substrate to a third depth, the impurity concentration of the second conductivity type impurities of the collector layer is distributed constantly from the lower surface of the semiconductor substrate to a fourth depth, the third depth is deeper than the fourth depth, and the impurity concentration of the first conductivity type impurities is higher than the impurity concentration of the second conductivity type impurities at all depths of the collector layer. Moreover, in the second semiconductor device, both the cathode layer and the collector layer may have the above configuration. It should be noted that, in this specification, the state that the impurity concentration "is distributed constantly" may be a distribution with a substantially constant concentration and means that the distribution does not have to have a distribution profile with a clear peak such as a Gaussian distribution profile obtained by thermal diffusion but may be a substantially constant distribution profile such as those obtained by laser annealing treatment.

When a manufacturing process of irradiating first conductivity type impurity ions to the entire lower surface of a semiconductor wafer is performed in order to form the collector layer, it is effective to use the technologies according to the first and second semiconductor devices for the cathode layer. In this case, the first conductivity type impurity ions irradiated in order to form the collector layer is also doped to the cathode layer. That is, in forming the cathode layer, the doping of the first conductivity type impurity ions to the lower surface of the semiconductor wafer is the same process as the doping of the first conductivity type impurity ions in order to form the collector layer of the semiconductor device. According to the technologies according to the first and second semiconductor devices, in the cathode layer, the impurity concentration of the second conductivity type impurities can be made to be distributed in a range wider in a depth direction of the semiconductor substrate than that of the impurity concentration of the first conductivity type impurities. Thus, even if an error or a shift occurs in doping positions or half widths of the first conductivity type impurity ions and the second conductivity type impurity ions, the state in which the impurity concentration of the second conductivity type impurities is higher than the impurity concentration of the first conductivity type impurities at all the depths of the cathode layer can be realized more reliably.

Moreover, when a manufacturing process of irradiating second conductivity type impurity ions to the entire lower surface of a semiconductor wafer is performed in order to form the cathode layer, it is effective to use the technologies according to the first and second semiconductor devices for the collector layer. In this case, the second conductivity type impurity ions irradiated in order to form the cathode layer is also doped to the collector layer. That is, in forming the collector layer, the doping of the first conductivity type impurity ions to the lower surface of the semiconductor wafer is the same process as the doping of the second conductivity type impurity ions in order to form the cathode layer of the semiconductor device. According to the technologies according to the first and second semiconductor devices, in the collector layer, the impurity concentration of the first conductivity type impurities can be made to be distributed in a range wider in a depth direction of the semiconductor substrate than that of the impurity concentration of the second conductivity type impurities. Thus, even if an error or a shift occurs in doping positions or half widths of the first conductivity type impurity ions and the second conductivity type impurity ions, the state in which the impurity concentration of the first conductivity type impurities is higher than the impurity concentration of the second conductivity type impurities at all the depths of the collector layer can be realized more reliably.

In the methods for manufacturing the first and second semiconductor devices disclosed in this specification, prior-art known impurity ions can be used as the first conductivity type impurity ions and the second conductivity type impurity ions. Moreover, the order of forming the cathode layer and the collector layer can be changed as appropriate.

In the method for manufacturing the first semiconductor device, in the annealing of the semiconductor wafer that has been doped with the impurity ions, the prior-art known annealing methods can be used. They are not limiting, but a method of heating the entire semiconductor wafer in an annealing furnace may be used, for example, or a method capable of local annealing such as laser annealing may be used.

In the method for manufacturing the second semiconductor device, in the annealing of the cathode layer or the collector layer of the semiconductor wafer that has been doped with impurity ions, the laser annealing method is used. By using the laser annealing method, a distribution of the impurity concentration can be made constant. When the laser annealing method is used, by using a mask, selective annealing of a lower surface of the semiconductor wafer is also possible (annealing of only the diode region, for example). By adjusting energy intensity of a laser used in the laser annealing, annealing can be performed from the lower surface of the semiconductor wafer which is an irradiated surface to a desired depth. It should be noted that the laser annealing from the lower surface of the semiconductor wafer to a deeper depth is preferably performed prior to the laser annealing to a shallower depth.

Embodiment 1

First Semiconductor Device

Figure 2:
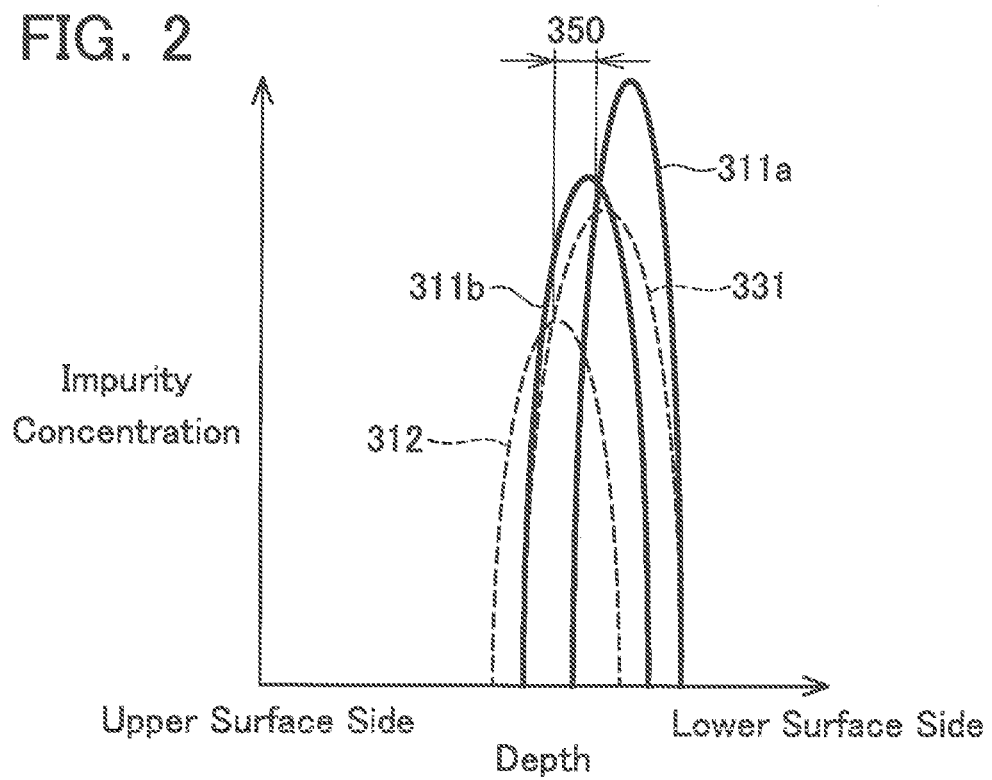
FIG. 2 is a graph illustrating a distribution of impurity concentration in the vicinity of a lower surface of a diode region in the semiconductor device according to the embodiment 1.

In an embodiment 1, a first semiconductor device 10 illustrated in FIGS. 1 and 2 is exemplified in explanation. The semiconductor device 10 is an RC-IGBT in which a diode and an IGBT are formed on a semiconductor substrate.

The semiconductor device 10 comprises a semiconductor substrate 100, an insulated gate 137 formed on an upper surface side of the semiconductor substrate 100 and surface insulating films 128 and 138, upper surface electrodes 101 and 102 in contact with the upper surface of the semiconductor substrate 100, and a lower surface electrode 103 in contact with the lower surface of the semiconductor substrate 100. The semiconductor substrate 100 comprises a diode region 11 and an IGBT region 13. The upper surface electrode 101 is formed on an upper surface of the diode region 11, and the upper surface electrode 102 is formed on an upper surface of the IGBT region 13.

The semiconductor substrate 100 comprises an $n^+$-type cathode layer 111 and a $p^+$-type collector layer 131, an n-type buffer layer 112, an n-type drift layer 113, a p-type diode body layer 114 and an IGBT body layer 134, a $p^+$-type anode layer 115, a $p^+$-type body contact layer 135, and an $n^+$-type emitter layer 136. In the IGBT region 13, the insulated gate 137 penetrating the IGBT body layer 134 from the upper surface side of the semiconductor substrate 100 and reaching the drift layer 113 is formed. On a boundary between the cathode layer 111 and the collector layer 131, a p-type separation layer 121 is formed on the upper surface side of the semiconductor substrate.

FIG. 2 illustrates a distribution of an impurity concentration on a lower surface side of the diode region 11 of the semiconductor substrate 100. Reference numerals 311a, 311b, and 312 denote a distribution of the n-type impurity concentration having a Gaussian distribution profile, and reference numeral 331 denotes a distribution of the p-type impurity concentration having a Gaussian distribution profile. A peak of the distribution 312 is located in the buffer layer 112. Peaks of the distributions 311a and 311b are located in the cathode layer 111. A peak of the distribution 331 is located in the cathode layer 111. A peak position of the distribution 331 is located deeper from the lower surface than the peak position of the distribution 311a and shallower from the lower surface than the distribution 311b.

Subsequently, operation of the semiconductor device 10 will be explained.

(During IGBT Operation)

A potential Va of the lower surface electrode 103 is set to a potential higher than a potential Vb of the upper surface electrode 101 and a potential Vc of the upper surface electrode 102 (Va Vb, Vc), and a positive voltage (positive bias) is applied to the insulated gate 137 and then, a channel is formed in the vicinity of the insulated gate 137 in the IGBT body layer 134. Through this channel, electrons which are a majority carrier are introduced from the emitter layer 136 to the drift layer 113. Moreover, positive holes are introduced from the collector layer 131 to the drift layer 113. When the positive holes which are a minority carrier are introduced to the drift layer 113, conductivity modulation occurs in the drift layer 113, and resistance of the drift layer 113 lowers. Since the electrons and the positive holes move as above, an IGBT current flows from the lower surface side (collector layer 131 side) to the upper surface side (emitter layer 136 side) of the semiconductor substrate 100.

(During Diode Operation)

Subsequently, by setting the potential Va of the lower surface electrode 103 lower than the potential Vb of the upper surface electrode 101 and the potential Ye of the upper surface electrode 102 (Va<Vb, Vc), positive holes are introduced from the anode layer 115 to the drift layer 113 via the diode body layer 114 in the diode region 11. As a result, a diode current (reflux current) flows from the anode layer 115 side to the cathode layer 111 side.

In the semiconductor device 10, it is preferable that an n-type impurity concentration of the distribution 311a is higher than the p-type impurity concentration of the distribution 331 in the entire region in the cathode layer 111, but as illustrated in FIG. 2, a region 350 in which the p-type impurity concentration of the distribution 331 is higher than the n-type impurity concentration of the distribution 311a might be formed. If the distribution 311b is not present in the cathode layer 111, the p-type impurity concentration becomes higher than the n-type impurity concentration in the region 350, the VI characteristics during the diode operation of the semiconductor device 10 deteriorates, and snapback can easily occur.

Figure 3:
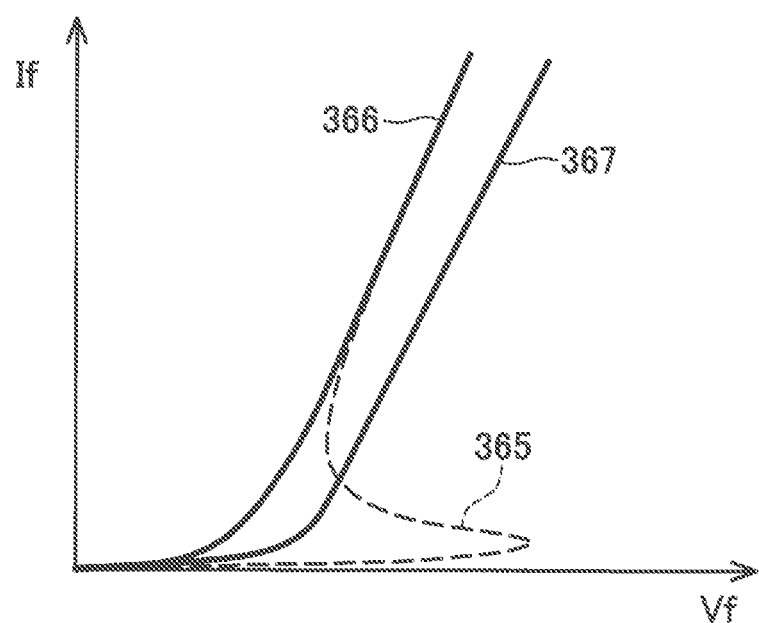
FIG. 3 is a graph for explaining characteristics of the semiconductor device according to the embodiment 1.

Reference numeral 367 in FIG. 3 is a diagram conceptually illustrating the VI characteristics of the diode region 11 of the semiconductor device 10. Reference character IF in the vertical axis denotes a current value, while reference character VF in the lateral axis denotes a voltage value. For comparison, the VI characteristics of the semiconductor device having a region in which the p-type impurity concentration is higher than the n-type impurity concentration in the cathode layer is exemplified by reference numerals 365 and 366.

If there is the region in which the p-type impurity concentration is higher than the n-type impurity concentration in the cathode layer, as indicated by reference numerals 365 and 366, the VI characteristics deteriorate. Moreover, as indicated by reference numeral 365, snapback occurs in some cases. If snapback occurs, as indicated by reference numeral 365, when the semiconductor device is on, the current increases at the initial stage in accordance with a rise in the applied voltage, but when the applied voltage reaches a specific switching voltage, a phenomenon (negative resistance) in which the current value decreases with respect to the rise of the applied voltage is exhibited temporarily. Then, the applied voltage further rises after that and when it reaches a specific holding voltage, the current increases again.

In the semiconductor device 10, the distribution 311b is present in the region 350, and in the region 350, the n-type impurity concentration of the distribution 311b is higher than the p-type impurity concentration of the distribution 331. Since the peak of the distribution 311a and the peak of the distribution 311b are located in the cathode layer 111, the n-type impurity concentration can be made to be distributed in a range wider in the depth direction of the semiconductor substrate 100 than the p-type impurity concentration in the cathode layer 111. Thus, by designing dose amounts of the distributions 311a, 311b, and 331 as appropriate in advance, even if an error or a shift occurs in the peak positions or half widths of the distributions 311a, 311b, and 331, the state in which the p-type impurity concentration is higher than the n-type impurity concentration at all the depths in the cathode layer 111 can be easily realized with reliability. According to the semiconductor device 10, suppression of deterioration of the VI characteristics and occurrence of snapback can be easily realized.

(Method for Manufacturing First Semiconductor Device)

Figure 4:
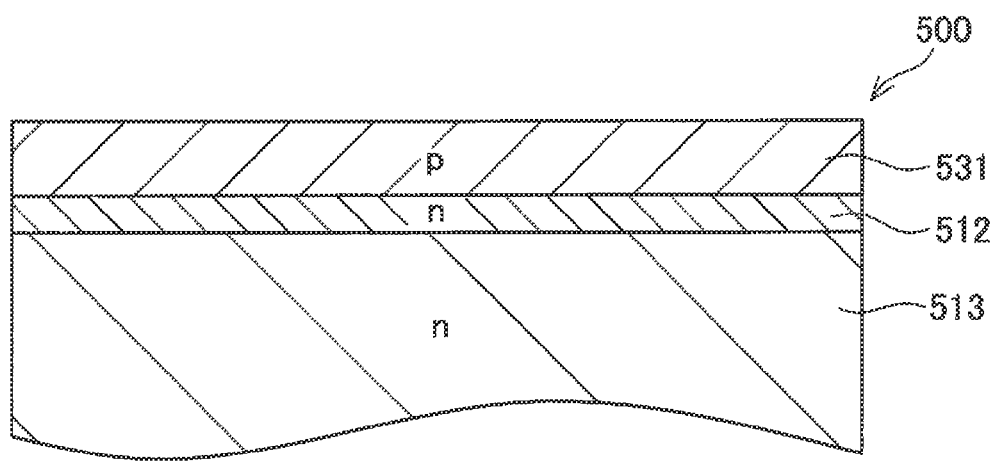
FIG. 4 is a diagram for explaining a manufacturing process of the semiconductor device according to the embodiment 1.
Figure 7:
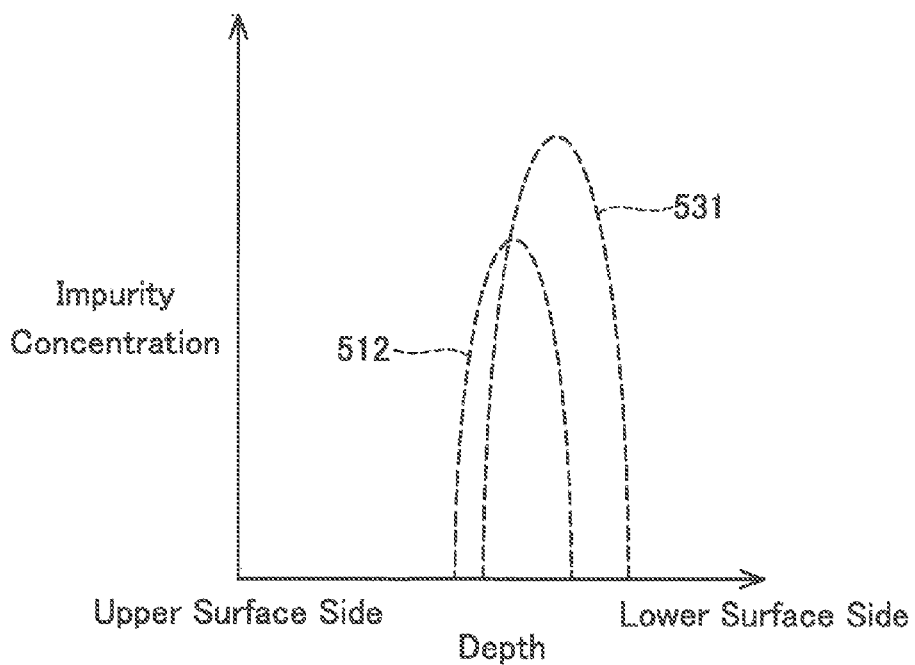
FIG. 7 is a graph illustrating a distribution of the impurity concentration in the vicinity of the lower surface of the diode region in the manufacturing process illustrated in FIG. 4.

Subsequently, a method for manufacturing the semiconductor device 10 will be described. As illustrated in FIG. 4, an n-type semiconductor wafer 500 in which the structure of the upper surface side of the semiconductor substrate 100 is formed is prepared, n-type impurity ions are doped to the lower surface (surface on which the cathode layer 111 and the collector layer 131 are to be formed) of the semiconductor wafer 500 so as to form an n-type ion doped layer 512 which becomes the buffer layer 112. Subsequently, p-type impurity ions are doped to the lower surface of the semiconductor wafer 500 so as to form a p-type ion doped layer 531 in which a part thereof becomes the collector layer 131. FIG. 7 illustrates a distribution of impurity concentrations of the p-type ion doped layer 531 and the n-type ion doped layer 512. A peak position of the p-type ion doped layer 531 is located in a region shallower from the lower surface than a peak position of the n-type ion doped layer 512. It should be noted that, on the contrary to the above-described order, the n-type ion doped layer 512 may be formed after the p-type ion doped layer 531 is formed. Alternatively, the forming of the structure of the upper surface side of the semiconductor substrate 100 may be performed after the forming of the structure of the lower surface side.

Figure 5:
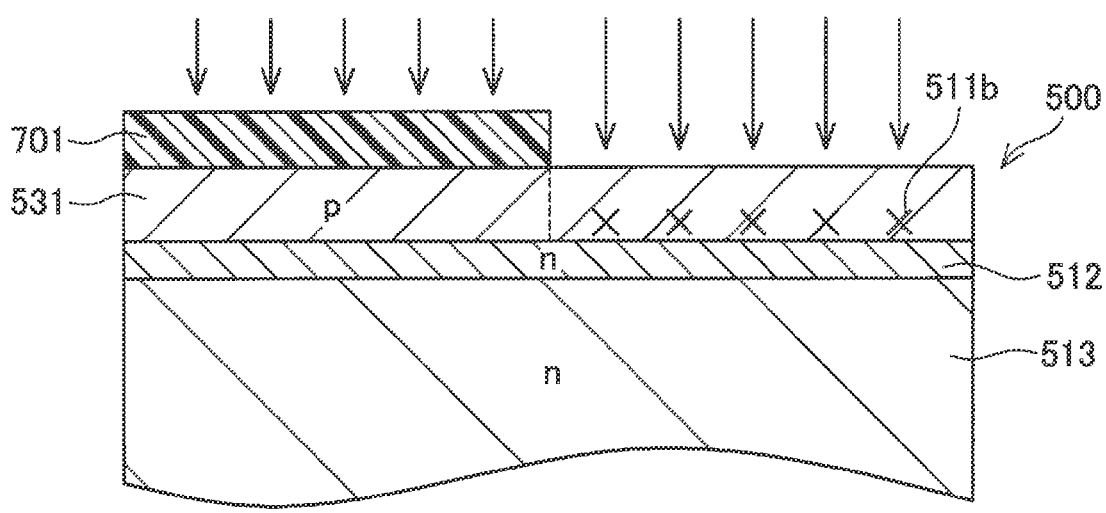
FIG. 5 is a diagram for explaining the manufacturing process of the semiconductor device according to the embodiment 1.
Figure 8:
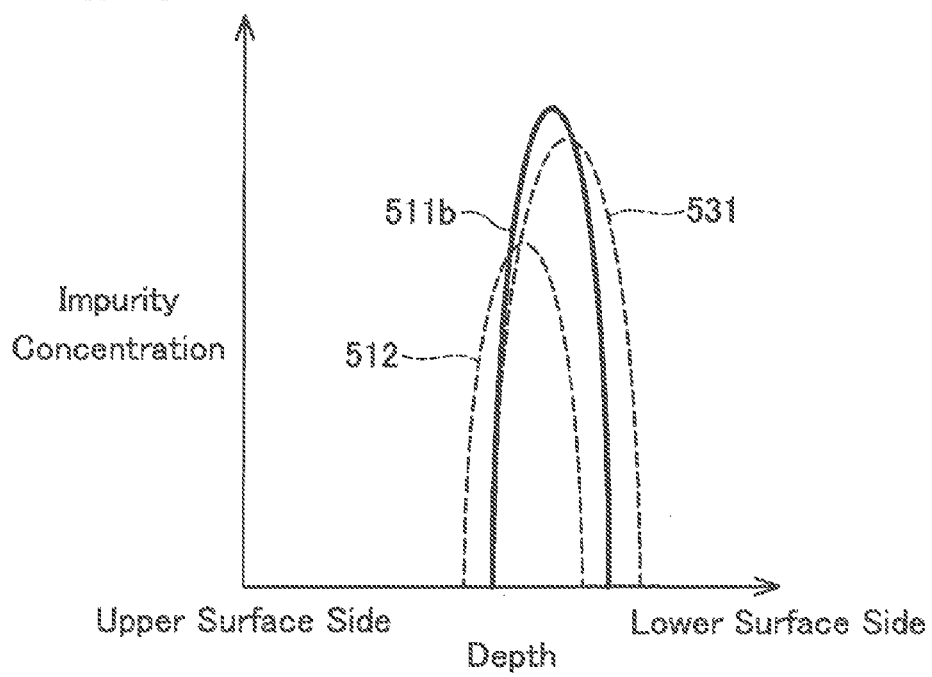
FIG. 8 is a graph illustrating a distribution of the impurity concentration in the vicinity of the lower surface of the diode region in the manufacturing process illustrated in FIG. 5.

Subsequently, as illustrated in FIG. 5, photo-etching is performed in order to selectively form a mask 701 on the lower surface of the IGBT region of the semiconductor wafer 500. The n-type impurity ions are selectively doped to the p-type ion doped layer 531 on the lower surface of the diode region of the semiconductor wafer 500 via the mask 701. As a result, an n-type ion doped layer 511b is formed in the p-type ion doped layer 531. As illustrated in FIG. 8, the n-type impurity ions are doped so that a peak position of the n-type ion doped layer 511b is located in a region deeper from the lower surface from the peak position of the p-type ion doped layer 531.

Figure 6:
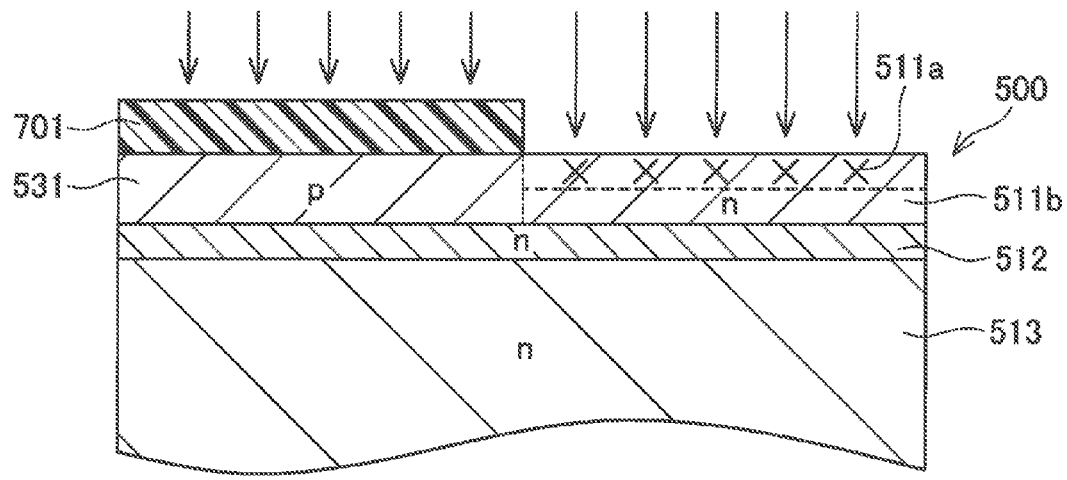
FIG. 6 is a diagram for explaining the manufacturing process of the semiconductor device according to the embodiment 1.
Figure 9:
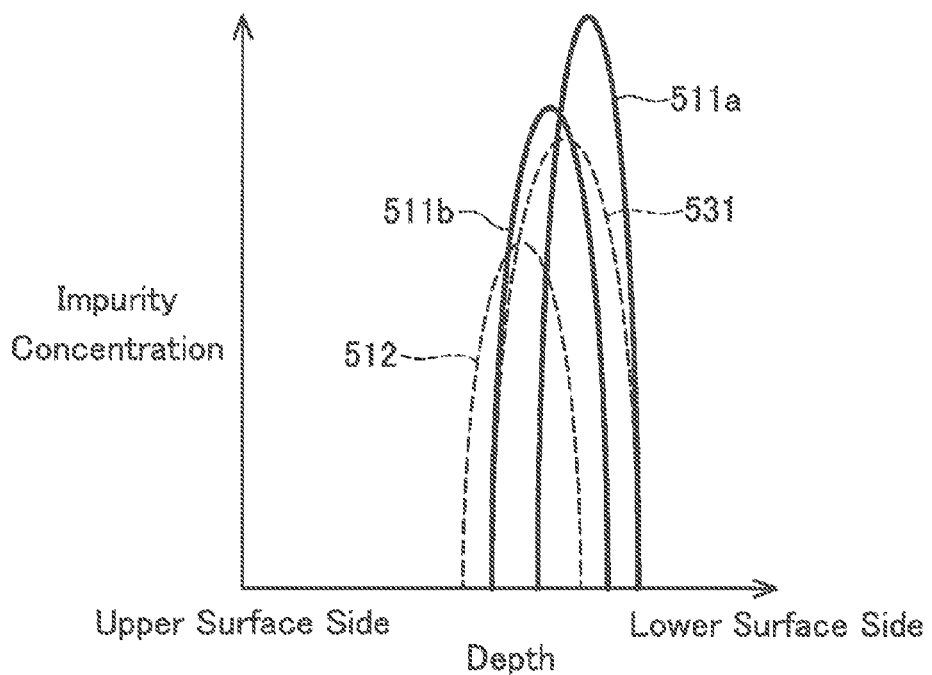
FIG. 9 is a graph illustrating a distribution of the impurity concentration in the vicinity of the lower surface of the diode region in the manufacturing process illustrated in FIG. 6.

Subsequently, as illustrated in FIG. 6, in a state in which the mask 701 is still present, the n-type impurity ions are further doped to the p-type ion doped layer 531 on the lower surface of the diode region of the semiconductor wafer 500. As a result, an n-type ion doped layer 511a is formed in the p-type ion doped layer 531. As illustrated in FIG. 9, the n-type impurity ions are doped so that a peak position of the n-type ion doped layer 511a is located in a region shallower from the lower surface than the peak position of the p-type ion doped layer 531. Moreover, on the lower surface of the diode region, conditions of doping of the p-type and n-type ions are adjusted so that the impurity concentrations of the n-type ion doped layers 511a and 511b are higher than the p-type impurity concentration of the p-type ion doped layer 531. It should be noted that, on the contrary to the above-described order, the n-type ion doped layer 511b may be formed after the n-type ion doped layer 511a is formed. Moreover, two n-type ion doped layers which become the cathode layers 111 are formed by doping the n-type impurity ions two times, but this is not limiting. Three or more n-type ion doped layers which become the cathode layers 111 may be formed by doping the n-type impurity ions three times or more.

Subsequently, the semiconductor wafer 500 after the mask 701 has been removed by ashing or the like is annealed by using an annealing furnace or the like. As a result, the structure of the lower surface side of the semiconductor substrate 100 can be formed. Moreover, by forming the other structures of the semiconductor device 10 such, as the upper surface electrodes 101 and 102, the lower surface electrode 103 and the like, the semiconductor device 10 can be manufactured. It should be noted that, the p-type ion doped layer 531 and the n-type ion doped layer 512 may be formed after the n-type ion doped layers 511a and 511b are formed, and the mask 701 is removed.

As described above, the semiconductor device 10 can be manufactured without providing irregularity on the lower surface of the semiconductor substrate by performing a complicated manufacturing process such as Japanese Patent Application Publication No. 2011-507299 and Japanese Patent Application Publication No. 2011-507300. It is easy to increase the number of times of doping the n-type impurity ions, and there is no need to perform a complicated manufacturing process. According to the above method for manufacturing, a semiconductor device in which deterioration of the VI characteristics and occurrence of snapback are suppressed can be easily manufactured.

Embodiment 2

Second Semiconductor Device

Figure 10:
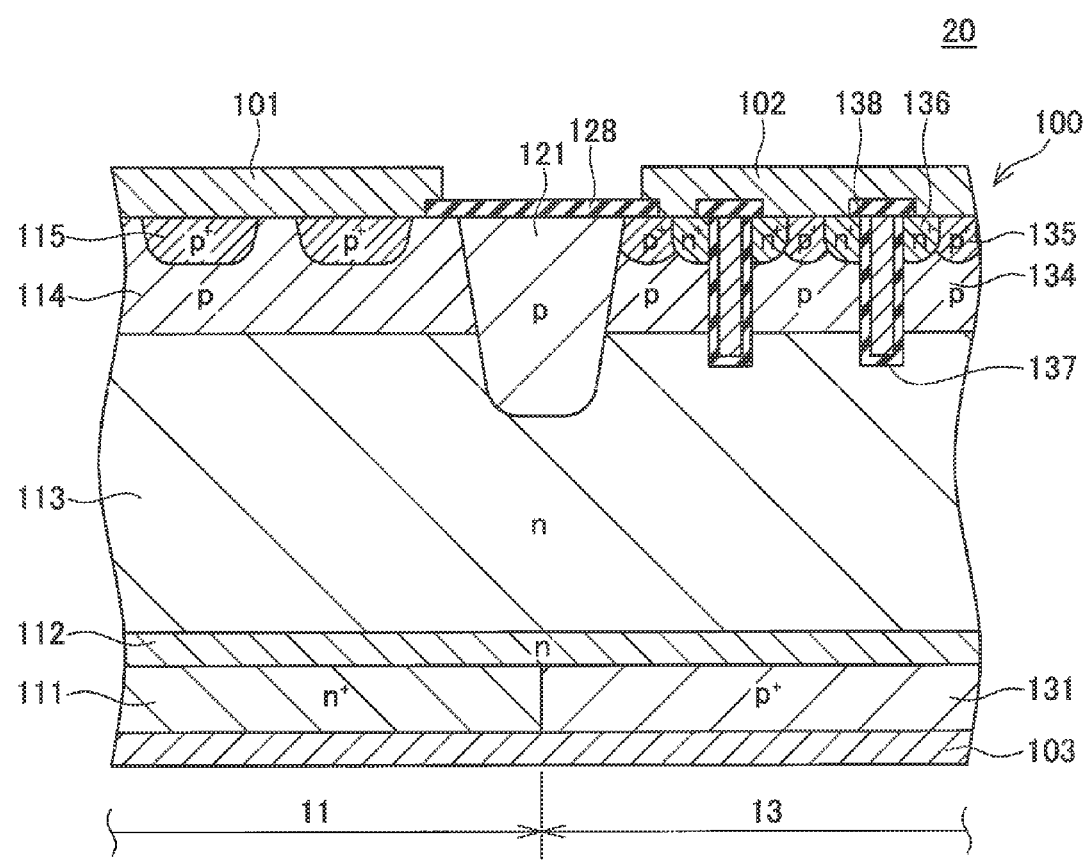
FIG. 10 is a sectional view of a semiconductor device according to an embodiment 2.
Figure 11:
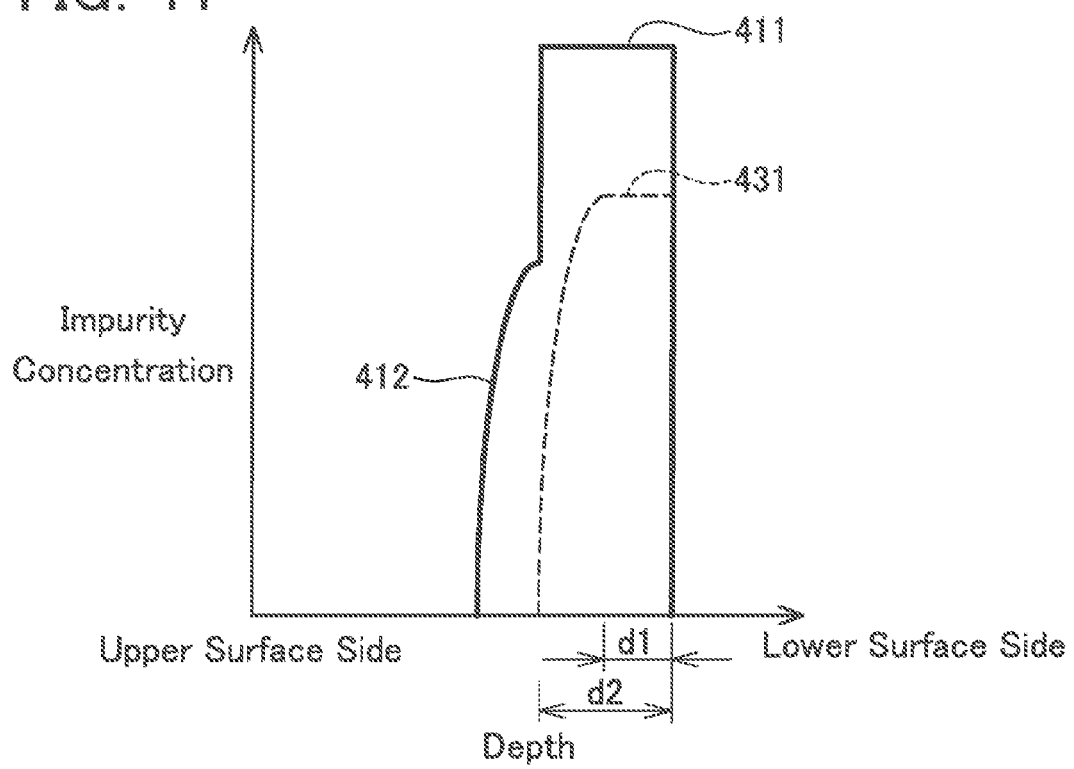
FIG. 11 is a graph illustrating a distribution of impurity concentration in the vicinity of a lower surface of a diode region in the semiconductor device according to the embodiment 2.
Figure 12:
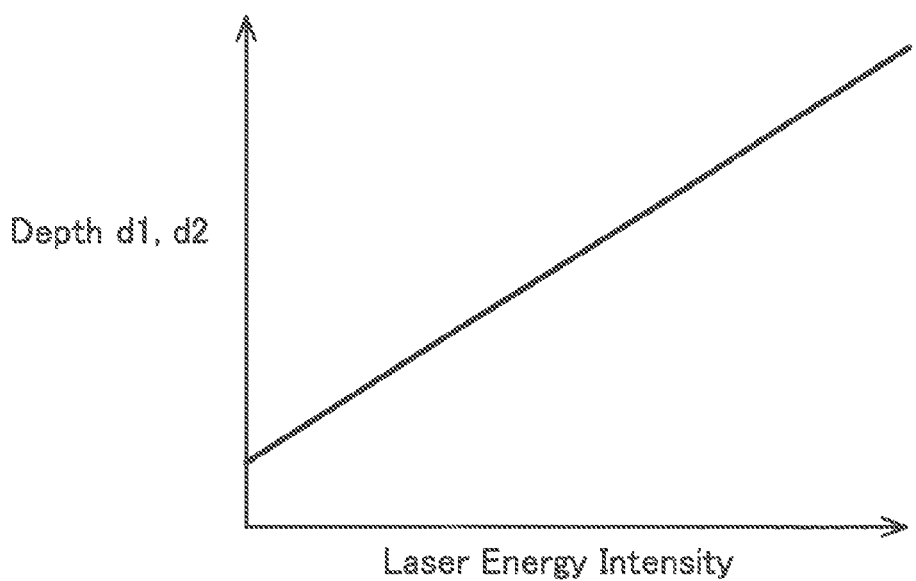
FIG. 12 is a graph illustrating a relationship between laser energy intensity and a depth of a semiconductor substrate to be annealed in laser annealing.

In an embodiment 2, a semiconductor device 20 illustrated in FIGS. 10 and 11 is exemplified in explanation. Since a section structure of the semiconductor device 20 is similar to the structure of the semiconductor device 10 illustrated in FIG. 1, the explanation will be omitted. The semiconductor device 20 is different from the semiconductor device 10 in the distribution of the impurity concentration in the vicinity of the lower surface of the diode region 11. As illustrated in FIG. 11, in the semiconductor device 20, a distribution 411 of an n-type impurity concentration and a distribution 431 of a p-type impurity concentration of the cathode layer 111 are both distributed constantly to a certain depth from the lower surface of the semiconductor substrate 100. A distribution 412 of the n-type impurity concentration of the buffer layer 112 is distributed in a curve pattern. The distribution 431 has a constant concentration from the lower surface of the semiconductor substrate 100 to a first depth d1. The distribution 411 has a constant concentration from the lower surface of the semiconductor substrate 100 to a second depth d2. The depth d1 is smaller than the depth d2 (d1<d2). By performing laser annealing, the distribution of the impurity concentration can be made constant. As illustrated in FIG. 12, the larger the laser energy intensity used in the laser annealing is, the deeper the first depth d1 and the second depth d2 can be. The first depth d1 and the second depth d2 can be adjusted by performing laser annealing after adjustment of the laser energy intensity.

In the above-described second semiconductor device 20, the n-type impurity concentration and the p-type impurity concentration of the cathode layer 111 are both distributed constantly from the lower surface of the semiconductor substrate 100 to a certain depth. Since the impurity concentration is distributed constantly, by setting the second depth d2 deeper than the first depth d1, the n-type impurity concentration can be distributed in a range wider in the depth direction of the semiconductor substrate 100 than the p-type impurity concentration in the cathode layer 111. Thus, by designing dose amounts of the n-type impurities and the p-type impurities as appropriate, the state in which the n-type impurity concentration is higher than the p-type impurity concentration at all the depths of the cathode layer 111 can be easily realized with reliability. According to the semiconductor device 20, as illustrate in FIG. 3, suppression of deterioration of the VI characteristics and occurrence of snapback can be realized easily. Since the operation of the semiconductor device 20 is similar to that of the semiconductor device 10, the explanation will be omitted.

(Method for Manufacturing Second Semiconductor Device)

Figure 13:
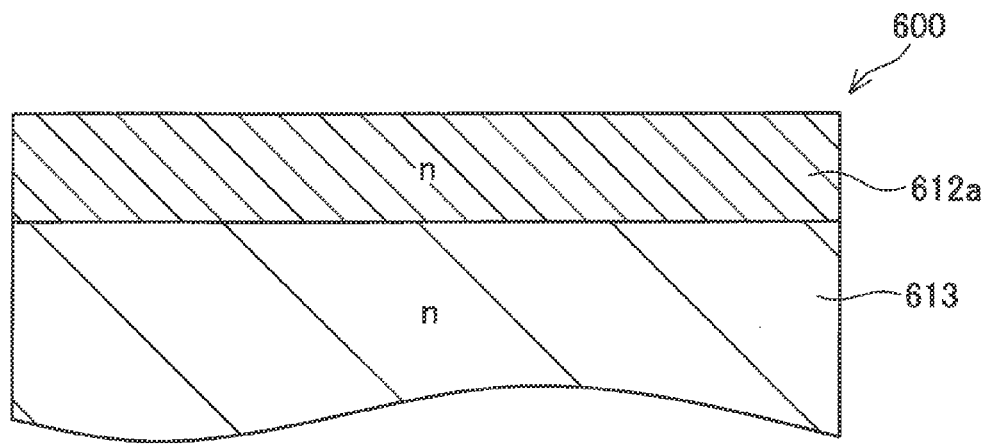
FIG. 13 is a diagram for explaining a manufacturing process of the semiconductor device according to the embodiment 2.

A method for manufacturing the semiconductor device 20 will be described. As illustrated in FIG. 13, an n-type semiconductor wafer 600 in which the structure of the upper surface side of the semiconductor substrate 100 is formed is prepared, n-type impurity ions are doped to the lower surface (surface on which the cathode layer 111 and the collector layer 131 are to be formed) of the semiconductor wafer 600 so as to form an n-type ion doped layer 612a which becomes the buffer layer 112.

Figure 14:
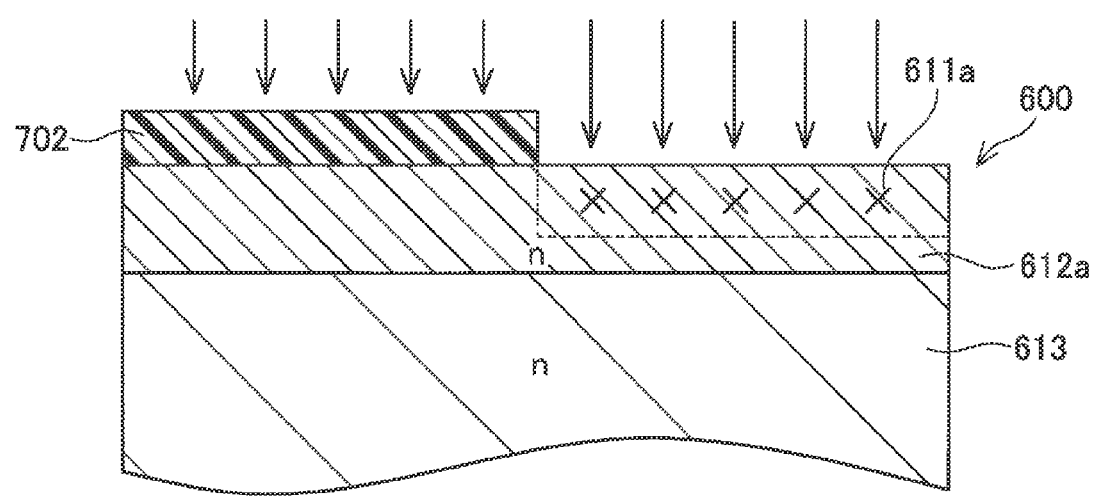
FIG. 14 is a diagram for explaining a manufacturing process of the semiconductor device according to the embodiment 2.
Figure 18:
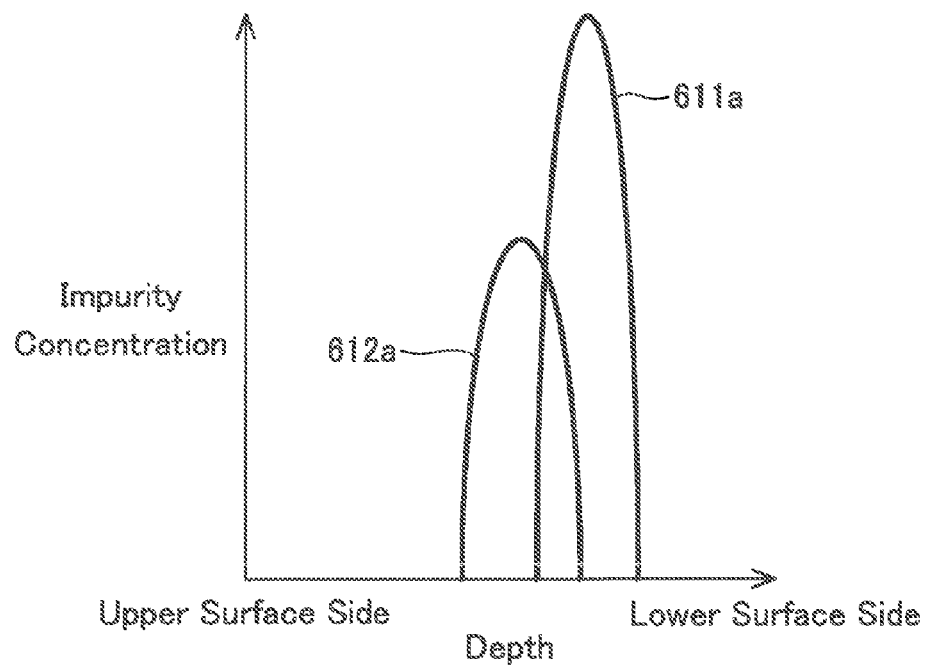
FIG. 18 is a graph illustrating distribution of the impurity concentration in the vicinity of the lower surface of the diode region in the manufacturing process illustrated in FIG. 14.

Subsequently, as illustrated in FIG. 14, photo-etching is performed in order to selectively form a mask 702 on the lower surface of the IGBT region of the semiconductor wafer 600. It should be noted that, for the mask 702, a mask material such as an oxide film is used so as to be used as a mask in laser annealing which will be described later. The n-type impurity ions are selectively doped to the n-type ion doped layer 612a on the lower surface of the diode region of the semiconductor wager 600 via the mask 702. As a result, an n-type ion doped layer 611a is formed in the n-type ion doped layer 612a. As illustrated in FIG. 18, the n-type impurity ions are doped so that a peak position of the n-type ion doped layer 612a is located in a region deeper from the lower surface than a peak position of the n-type ion doped layer 611a. It should be noted that one n-type ion doped layer which becomes the cathode layer 111 is formed by doping the n-type impurity ions one time, but this is not limiting. Two or more n-type ion doped layers which become the cathode layers 111 may be formed by doping the n-type impurity ions two times or more. Moreover, the forming of the n-type ion doped layer 612a may be performed after the forming of the n-type ion doped layer 611a.

Figure 15:
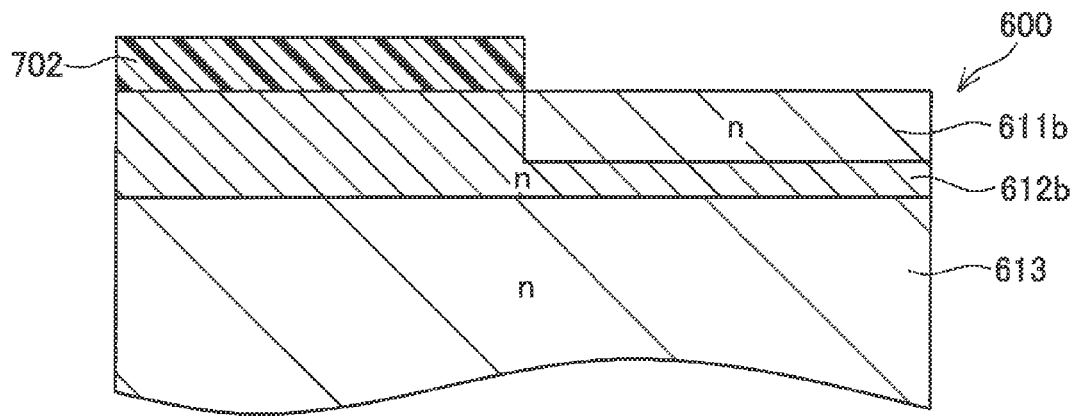
FIG. 15 is a diagram for explaining a manufacturing process of the semiconductor device according to the embodiment 2.
Figure 19:
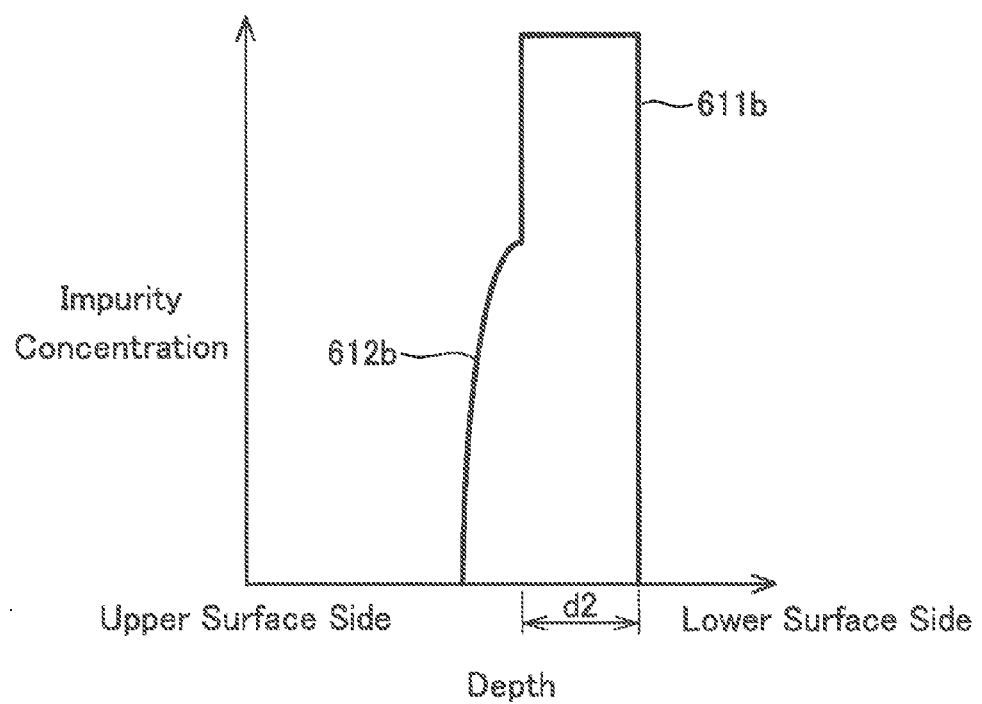
FIG. 19 is a graph illustrating a distribution of the impurity concentration in the vicinity of the lower surface of the diode region in the manufacturing process illustrated in FIG. 15.

Subsequently, in a state in which the mask 702 is still present, a laser beam is irradiated to the n-type ion doped layers 612a and 611a on the lower surface of the diode region of the semiconductor wafer 600 so as to perform laser annealing. The energy intensity of the laser beam to be irradiated is adjusted so that annealing can be performed to the second depth d2 by using the relationship illustrated in FIG. 12. As a result, as illustrated in FIG. 15, an n-type layer 611b and an n-type layer 612b are formed. As illustrated in FIG. 19, an n-type impurity concentration distribution of the n-type layer 611b is constant from the lower surface of the semiconductor substrate 100 to the second depth d2. It should be noted that, in the above, laser irradiation is performed in the state in which the mask 702 is present, but the laser beam may be irradiated to the n-type ion doped layers 612a and 611a on the entire lower surface of the semiconductor wafer 600 after the mask 702 is removed.

Figure 16:
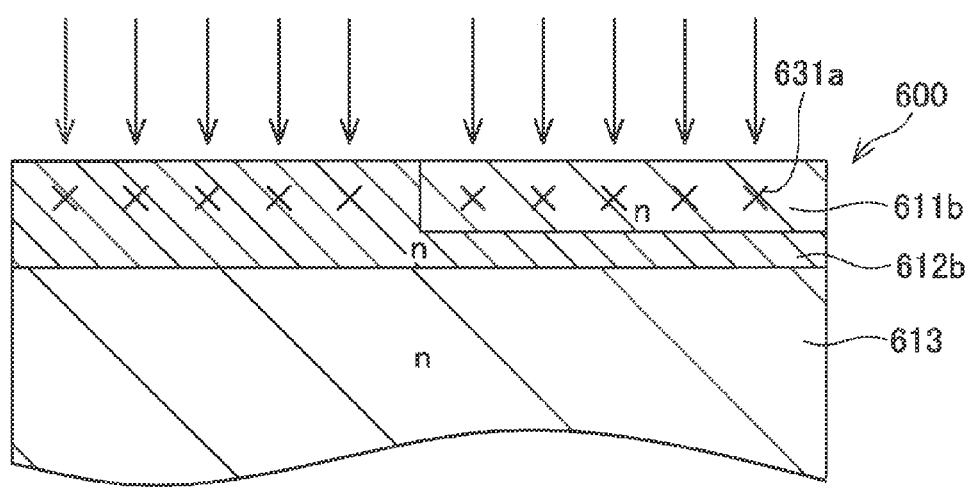
FIG. 16 is a diagram for explaining a manufacturing process of the semiconductor device according to the embodiment 2.
Figure 20:
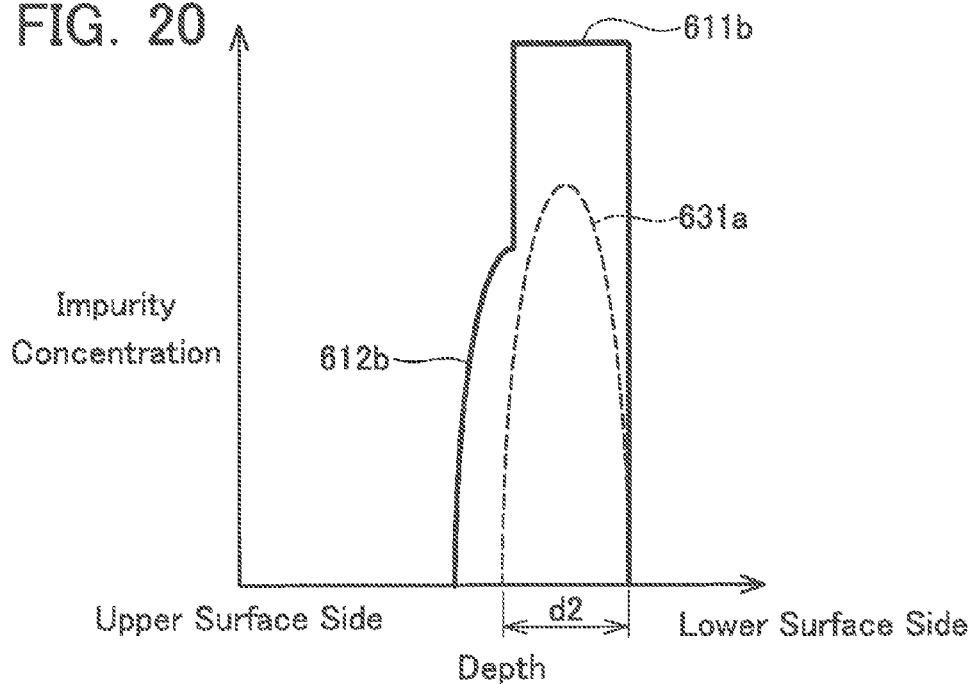
FIG. 20 is a graph illustrating a distribution of the impurity concentration in the vicinity of the lower surface of the diode region in the manufacturing process illustrated in FIG. 16.
Figure 21:
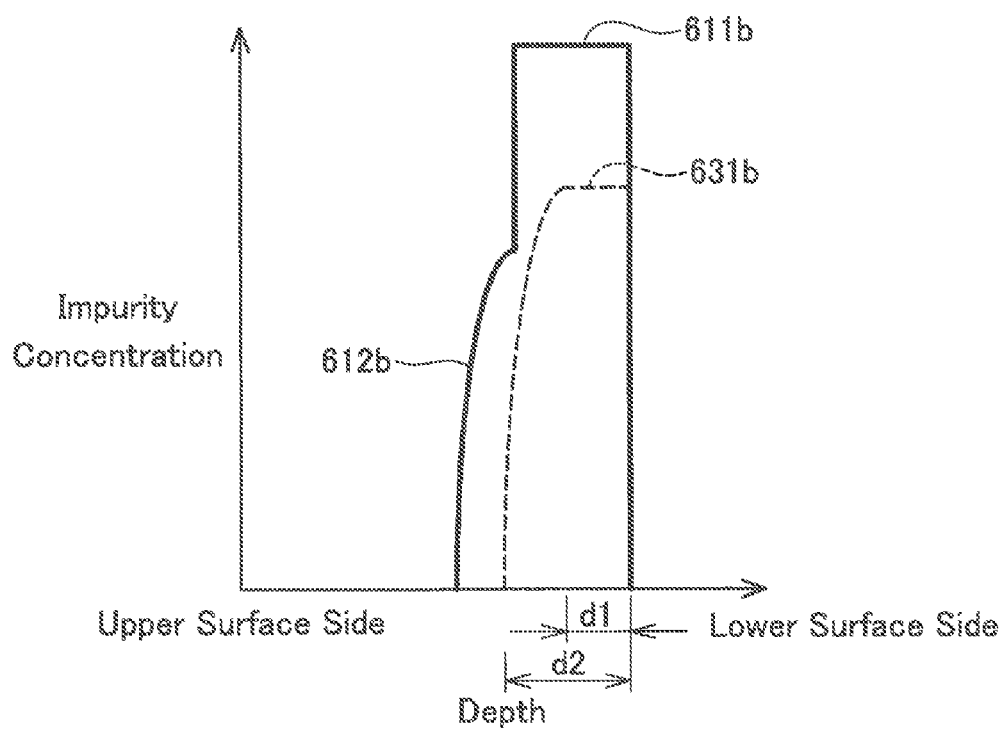
FIG. 21 is a graph illustrating a distribution of the impurity concentration in the vicinity of the lower surface of the diode region in the manufacturing process illustrated in FIG. 17.

Subsequently, as illustrated in FIG. 16, after the mask 702 is removed by ashing or the like, p-type impurity ions are doped to the semiconductor wafer 600. As a result, a p-type ion doped layer 631a is formed in the n-type layer 611b in the diode region 11 and in the n-type layer 612b in the IGBT region 13. As illustrated in FIG. 20, the p-type impurity concentration of the p-type ion doped layer 631a is lower than the n-type impurity concentration in the n-type layers 611b and 612b. It should be noted that the forming of the n-type ion doped layer 611a may be performed before the forming of the p-type ion doped layer 631a (after the irradiation of a laser beam to the n-type ion doped layer 611a) or after that. In this case, annealing of the n-type ion doped layer 611a may be performed at the same time as annealing of the p-type ion doped layer 631a.

Figure 17:
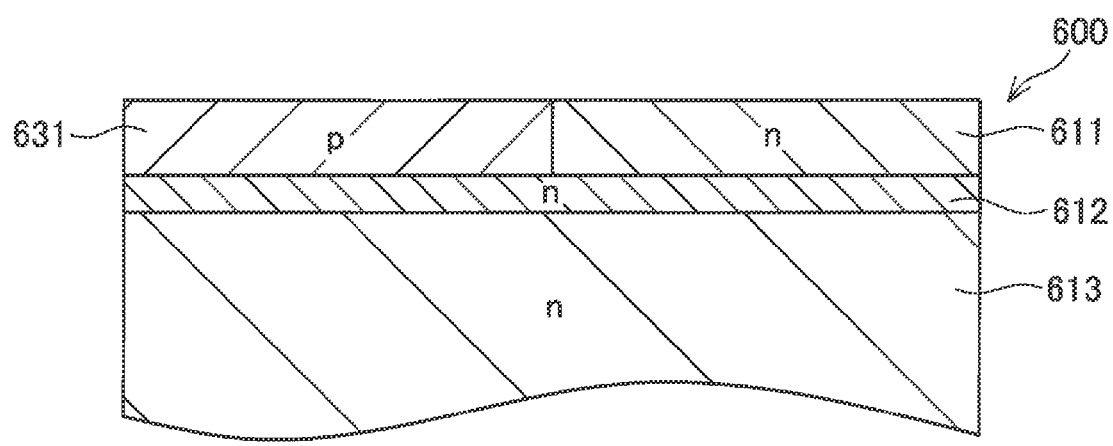
FIG. 17 is a diagram for explaining a manufacturing process of the semiconductor device according to the embodiment 2.

Subsequently, a laser beam is irradiated to the p-type ion doped layer 631a on the lower surface of the diode region of the semiconductor wafer 600 so as to perform laser annealing. The energy intensity of the laser beam to be irradiated is adjusted so that annealing can be performed to the first depth d1 by using the relationship illustrated in FIG. 12. As a result, as illustrated in FIG. 17, a p layer 631, an n layer 611 and an n layer 612 are formed. As illustrated in FIG. 20, a distribution of the p-type impurity concentration of the n layer 611 is constant from the lower surface of the semiconductor substrate 100 to the first depth d1. Moreover, by forming the other structures of the semiconductor device 20 such as the upper surface electrodes 101 and 102, the lower surface electrode 103 and the like, the semiconductor device 10 can be manufactured.

As described above, the semiconductor device 20 can be manufactured without providing irregularity on the lower surface of the semiconductor substrate by performing a complicated manufacturing process such as Japanese Patent Application Publication No. 2011-507299 and Japanese Patent Application Publication No. 2011-507300. Moreover, it is easy to perform leaser annealing several times while changing the laser intensity, and a complicated manufacturing process does not have to be performed. According to the above-described manufacturing method, a semiconductor device in which deterioration of the VI characteristics and occurrence of snapback are suppressed can be manufactured easily.

It should be noted that, in the above embodiment; the case in which, when the manufacturing process of irradiating the first conductivity type impurity ions to the entire lower surface of the semiconductor wafer is to be performed in order to form the collector layer, the technology according to the first and second semiconductor devices is used for the cathode layer is described, but this is not limiting. In the case in which, when the manufacturing process of irradiating the second conductivity type impurity ions to the entire lower surface of the semiconductor wafer is to be performed in order to form the cathode layer, the technology according to the first and second semiconductor devices is used for the collector layer, too, the above embodiment can be similarly put into practice with an appropriate change. It is naturally understood that the present invention can be similarly put into practice by replacing the distribution of the second conductivity type impurity concentration of the cathode layer in the embodiments 1 and 2 by the distribution of the first conductivity type impurity concentration of the collector layer, and by replacing the distribution of the first conductivity type impurity concentration of the cathode layer by the distribution of the second conductivity type impurity concentration of the collector layer, and the working effects according to the present application can be obtained.

The embodiments of the present invention have been described in detail, but they are mere exemplifications and do not limit a scope of claims. The technology described in the scope of the claims includes various variations and changes of the specific examples exemplified above.

The technical elements described in this specification or the attached drawings exert technical usability singularly or in various combinations and they are not limited to the combinations described in claims at the filing. Moreover, the technology exemplified in this specification or the attached drawings is capable of achieving a plurality of objects at the same time, and achievement of one of the objects has technical usability in itself.

The invention claimed is:

1. A semiconductor device comprising a semiconductor substrate in which a diode region and an IGBT region are formed, wherein
   the diode region comprises:
   a first conductivity type anode layer exposed at an upper surface of the semiconductor substrate;
   a second conductivity type diode drift layer formed on a lower surface side of the anode layer; and
   a second conductivity type cathode layer formed on a lower surface side of the diode drift layer,
   the IGBT region comprises:
   a second conductivity type emitter layer exposed at the upper surface of the semiconductor substrate;
   a first conductivity type IGBT body layer formed on a lower surface side of the emitter layer;
   a second conductivity type IGBT drift layer formed on a lower surface side of the IGBT body layer;
   a first conductivity type collector layer formed on a lower surface side of the IGBT drift layer; and
   an IGBT gate electrode facing a range of the IGBT body layer via an insulating film, wherein the range of the IGBT body layer separates the emitter layer from the IGBT drift layer,
   an impurity concentration of second conductivity type impurities of the cathode layer is distributed in a curve pattern having at least two peaks in a thickness direction of the semiconductor device,
   an impurity concentration of first conductivity type impurities of the cathode layer is distributed in a curved pattern having at least one peak in the thickness direction of the semiconductor device, and
   the impurity concentration of the second conductivity type impurities is higher than that of first conductivity type impurities at all depths of the cathode layer.

2. A method for manufacturing the semiconductor device according to claim 1 from a semiconductor wafer, the method comprising:
   forming the cathode layer of the semiconductor device, wherein the forming includes:
   doping first conductivity type impurity ions to a lower surface of the semiconductor wafer;
   doping second conductivity type impurity ions to the lower surface of the semiconductor wafer at least two times to different depths; and
   annealing the semiconductor wafer that has been doped with the first conductivity type impurity ions and the second conductivity type impurity ions.

3. A semiconductor device comprising a semiconductor substrate in which a diode region and an IGBT region are formed, wherein
   the diode region comprises:
   a first conductivity type anode layer exposed at an upper surface of the semiconductor substrate;
   a second conductivity type diode drift layer formed on a lower surface side of the anode layer; and a second conductivity type cathode layer formed on a lower surface side of the diode drift layer, the IGBT region comprises:
- a second conductivity type emitter layer exposed at the upper surface of the semiconductor substrate;
- a first conductivity type IGBT body layer formed on a lower surface side of the emitter layer;
- a second conductivity type IGBT drift layer formed on a lower surface side of the IGBT body layer;
- a first conductivity type collector layer formed on a lower surface side of the IGBT drift layer; and
- an IGBT gate electrode facing a range of the IGBT body layer via an insulating film, wherein the range of the IGBT body layer separates the emitter layer from the IGBT drift layer, an impurity concentration of first conductivity type impurities of the collector layer is distributed in a curve pattern having at least two peaks in a thickness direction of the semiconductor device, an impurity concentration of second conductivity type impurities of the collector layer is distributed in a curved pattern having at least one peak in the thickness direction of the semiconductor device, and the impurity concentration of the first conductivity type impurities is higher than that of second conductivity type impurities at all depths of the collector layer.

4. A method for manufacturing the semiconductor device according to claim 3 from a semiconductor wafer, the method comprising:

forming the collector layer of the semiconductor device, wherein the forming includes:

doping second conductivity type impurity ions to a lower surface of the semiconductor wafer;

doping first conductivity type impurity ions to the lower surface of the semiconductor wafer at least two times to different depths; and annealing the semiconductor wafer that has been doped with the first conductivity type impurity ions and the second conductivity type impurity ions.

* * * * *